(12) United States Patent
Priewasser

(10) Patent No.: US 7,708,855 B2
(45) Date of Patent: May 4, 2010

(54) METHOD FOR PROCESSING A SEMICONDUCTOR WAFER

(75) Inventor: Karl Heinz Priewasser, Munich (DE)

(73) Assignee: Disco Corporation, Tokyo (JP)

( * ) Notice: Subject to any disclaimer, the term of this patent is extended or adjusted under 35 U.S.C. 154(b) by 889 days.

(21) Appl. No.: 11/495,956

(22) Filed: Jul. 28, 2006

(65) Prior Publication Data
US 2007/0023136 A1 Feb. 1, 2007

(30) Foreign Application Priority Data
Jul. 29, 2005 (JP) ............................. 2005-221298

(51) Int. Cl.
B32B 37/02 (2006.01)
B32B 37/12 (2006.01)
B32B 38/04 (2006.01)
B32B 38/10 (2006.01)
B29C 65/52 (2006.01)
B29C 65/16 (2006.01)
B32B 37/14 (2006.01)
B32B 38/18 (2006.01)
B29C 65/02 (2006.01)

(52) U.S. Cl. ...................... 156/264; 156/250; 156/256; 156/272.8

(58) Field of Classification Search .............. 156/272.8, 156/256, 263, 264; 438/450, 463
See application file for complete search history.

(56) References Cited

U.S. PATENT DOCUMENTS

| | | | | |
|---|---|---|---|---|
| 5,888,883 A | * | 3/1999 | Sasaki et al. ................ 438/460 |
| 6,155,247 A | * | 12/2000 | Akram et al. ............ 125/23.01 |
| 6,407,363 B2 | * | 6/2002 | Dunsky et al. ......... 219/121.71 |
| 6,422,227 B1 | * | 7/2002 | Kobayashi et al. ....... 125/13.01 |
| 6,447,310 B1 | * | 9/2002 | Brown ........................ 439/108 |
| 6,770,544 B2 | * | 8/2004 | Sawada ...................... 438/462 |
| 2002/0042189 A1 | * | 4/2002 | Tanaka ....................... 438/450 |
| 2002/0104831 A1 | * | 8/2002 | Chang et al. ............. 219/121.7 |
| 2002/0127824 A1 | * | 9/2002 | Shelton et al. .............. 438/463 |
| 2003/0207062 A1 | * | 11/2003 | Herzog et al. .............. 428/40.1 |
| 2004/0180473 A1 | * | 9/2004 | Kawai ......................... 438/114 |
| 2005/0003635 A1 | * | 1/2005 | Takekoshi .................. 438/464 |
| 2006/0157191 A1 | * | 7/2006 | Matsuo et al. ........... 156/272.8 |
| 2008/0248730 A1 | * | 10/2008 | Priewasser ................... 451/54 |

FOREIGN PATENT DOCUMENTS

| | | | | |
|---|---|---|---|---|
| JP | 2004266163 A | * | 9/2004 | |
| JP | 2006192474 A | * | 7/2006 | |
| JP | 2004-266163 | | 9/2006 | |
| WO | WO 03011546 A1 | * | 2/2003 | |
| WO | WO 2005063435 A1 | * | 7/2005 | |

* cited by examiner

Primary Examiner—Philip C Tucker
Assistant Examiner—Sonya Mazumdar
(74) Attorney, Agent, or Firm—Brinks Hofer Gilson & Lione

(57) ABSTRACT

Disclosed is a method for processing a semiconductor wafer having plural devices divided by streets on a front surface thereof, the method comprising: adhering an adhesive film to a back surface of the semiconductor wafer; cutting the semiconductor wafer along the streets, thereby making pieces of devices; wherein the adhesive film is cut into a shape and a size identical to those of the streets by a laser beam; the semiconductor wafer is positioned such that streets coincide with cut lines of the adhesive film; the adhesive film is adhered to the semiconductor wafer.

8 Claims, 5 Drawing Sheets

METHOD FOR PROCESSING A SEMICONDUCTOR WAFER

This application claims priority under 35 U.S.C. §119 to Japanese Patent Application No. JP2005-221298 filed Jul. 29, 2005, the entire content of which is hereby incorporated by reference.

BACKGROUND OF THE INVENTION

1. Field of the Invention

The present invention relates to an improvement in a semiconductor wafer processing method including a step of adhering a die-bonding adhesive film onto a back surface of a semiconductor wafer having a plurality of devices (i.e., semiconductor devices) formed thereon.

2. Description of the Related Arts

An adhesive film called a DAF (die attach film) has been previously stuck onto a back surface of a device, thereby fabricating a package such as an MCP (multi-chip package) or an SiP (system-in package), in which a plurality of semiconductor chips are stacked. In order to achieve such a configuration, there has been known a method in which an adhesive film whose shape and size are equal to those of a wafer is stuck onto a back surface of the wafer ground into a predetermined thickness, and then, the adhesive film is cut or split together with the wafer. Otherwise, there has been known a method in which an adhesive film whose shape and size are equal to those of a wafer is stuck onto a back surface of a wafer previously ground and cut into individual devices, and then, the adhesive film is cut by a blade or a laser beam.

In the former method in which the adhesive film is cut together with the wafer, the blade is readily clogged with swarf produced from the adhesive film, or burrs are produced at the adhesive film, thereby causing bonding deficiency in die-bonding. In the latter method in which the adhesive film is cut later, the wafer is previously cut into the individual devices in advance, thereby inducing a phenomenon called die shift in which the arrangement of the devices is shifted, whereby it is impossible to cut the adhesive film by the blade. Therefore, the adhesive film must be cut by a laser beam. In this case, the adhesive film is required to be irradiated with the laser beam while correcting the position in accordance with the shift of the device, thereby raising a problem of degradation of working efficiency. Even in a case in which the laser beam is irradiated to the wafer without any die shift, there is a problem that the melted adhesive film adheres to a side surface of the device or the side surface of the device also is possibly damaged by the irradiation of the laser beam.

In order to solve the above-described problems, Japanese Patent Application Laid-open (JP-A) No. 2004-266163, for example, discloses a method, in which an adhesive film is pressed with a die, to be previously cut into a shape of a device, and thereafter, a wafer is adhesively positioned at the resultant adhesive film; to be then cut.

However, a die in conformity with the shape of the device has needed to be prepared in the above-described method, and therefore, a manufacturing cost has been increased, thereby raising a problem of cumbersome preparation and maintenance of the die in a manufacture line. In addition, the thickness of the adhesive film has been required to become thinner than 10 µm to 15 µm at present. In cutting such a thin material by pressing, the level of the bottom dead center of the die (i.e., an upper die) has needed to be adjusted in the order of several µm. Such precise adjustment has not been readily performed. Additionally, the cut adhesive film may be lifted up in contact with the upper die, and therefore, there has been apprehension that the adhesive film may be peeled off from a peeling sheet serving as a mount for the adhesive film. In this manner, a considerable difficulty has been presumed in press-cutting the adhesive film in an actual manufacturing site, and further, a high facility cost has been required for fabricating a precise die or press.

SUMMARY OF THE INVENTION

In view of this, an object of the present invention is to provide a semiconductor wafer processing method capable of not only solving problems such as clogging of a blade due to an adhesive film, occurrence of a burr, a damage on a device by a laser, and adhesion of the adhesive film to the device but also readily applicable with devices having various sizes and shapes or a very thin adhesive film and reducing a facility cost in addition to.

The present invention provides a method for processing a semiconductor wafer having plural devices divided by streets on a front surface thereof, the method comprising: adhering an adhesive film to a back surface of the semiconductor wafer; cutting the semiconductor wafer along the streets, thereby making pieces of devices; wherein the adhesive film is cut into a shape and a size identical to those of the streets by a laser beam; the semiconductor wafer is positioned such that streets coincide with cut lines of the adhesive film; the adhesive film is adhered to the semiconductor wafer.

According to the present invention, an adhesive film is cut in advance in the same shape and size as those of a street by a laser beam, and then, the resultant adhesive film and a semiconductor wafer are adhesively positioned, before the semiconductor wafer is cut along the streets into individual devices. In this manner, the device having the adhesive film individually adhering thereto can be obtained by cutting only the semiconductor wafer, thus preventing any clogging of a blade or any occurrence of a burr at the adhesive film. Furthermore, since the adhesive film is cut by a laser, the present invention is readily applicable to devices having various sizes and shapes or a very thin adhesive film, with an attendant advantage of no need for a precise press or die.

The present invention further provides a method for processing a semiconductor wafer having plural devices divided by streets and a protecting film on a front surface thereof, the method comprising: cutting the semiconductor wafer along the streets, thereby making pieces of devices; adhering an adhesive film to a back surface of the pieces of devices; wherein the adhesive film is cut into a shape and a size identical to those of the streets by a laser beam; pieces of devices are positioned such that contours thereof coincide with cut lines of the adhesive film; the adhesive film is adhered to the pieces of devices.

According to the second invention, the semiconductor wafer is cut along the streets into the individual devices, and further, the adhesive film is cut in advance in the same shape and size as those of the street by the laser beam, and then, the adhesive film and the individual devices are adhesively positioned. As a consequence, the device having the adhesive film individually adhering thereto can be obtained by peeling off the device from a protective film, thereby avoiding any inconvenience such as a damage on the device, which has been caused by the irradiation of the laser through clearances defined between the devices in the prior art. Moreover, since the adhesive film is cut by the laser, the present invention is readily applicable to the devices having various sizes and shapes or the very thin adhesive film, with an attendant advantage of no need for a precise press or die.

According to a second aspect of the present invention, a semiconductor wafer is cut into individual devices before it is bonded onto an adhesive film in an arbitrary method. For example, slits are formed at an obverse surface of the semiconductor wafer along streets (by dicing), and further, a back surface is ground into a state in which a protective film is stuck onto the obverse surface of the semiconductor wafer. In this state, the back surface is ground down to the slits, so that the semiconductor wafer is cut into the individual devices. Otherwise, a protective film may be stuck onto the obverse surface of the semiconductor wafer, to be diced from a back surface of the semiconductor wafer along streets. In this case, the semiconductor wafer is cut into the individual devices by dicing the semiconductor wafer down to the protective film.

The adhesive film may be half cut by the laser, to be then split after the formation of the individual devices. It is preferable to completely cut the adhesive film thereby a step can be omitted. For example, if a peeling sheet having an adhesive agent is stuck onto the back surface of the adhesive film, the original shape of the adhesive film can be held while the adhesive film is completely cut by the laser.

Otherwise, the adhesive film may be cut while being suctioned to a suction table, and then, in this state, a semiconductor wafer or device is bonded onto the adhesive film, thereby reducing the number of steps to a minimum. In this case, it is more preferable that the suction table is provided with heating means. The adhesive film is made of a material such as a thermoplastic resin capable of exhibiting adhesiveness by heating, and therefore, is allowed to adhere to the semiconductor wafer or device by heating by the heating means. Incidentally, a heater serving as the heating means may be housed inside of the suction table or disposed at the lower surface of the suction table. It is necessary to attach the peeling sheet to the adhesive film in order to prevent any adhesion of the adhesive film to the suction table.

The present invention can produce effects of the semiconductor wafer processing method capable of not only reducing a facility cost without any inconvenience such as the clogging of the blade due to the adhesive film, the occurrence of the burr, the damage on the device by the laser, or the adhesion of the adhesive film to the device but also readily applicable with the devices having the various sizes and shapes or the very thin adhesive film.

DESCRIPTION OF THE PREFERRED EMBODIMENTS

[1] Structure of Semiconductor Wafer Processing Apparatus

A description will be given below of an embodiment according to the present invention in reference to the attached drawings.

Figure 1:
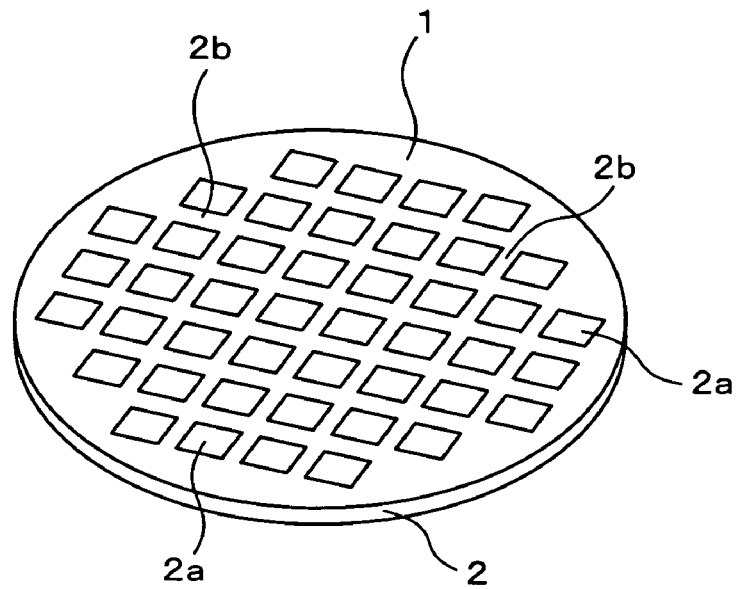
FIG. 1 is a schematic view of a semiconductor wafer of an embodiment of the invention.

FIG. 1 illustrates a disk-shaped semiconductor wafer, which is processed in the embodiment. At an obverse surface of a semiconductor wafer 2 are formed a plurality of devices 2a. The devices 2a are configured such that electronic circuits are formed in rectangular regions partitioned in a grid manner with streets 2b serving as cutting lines. Furthermore, a protective film 1 for protecting the devices 2a is stuck onto the obverse surface of the semiconductor wafer 2.

Figure 2:
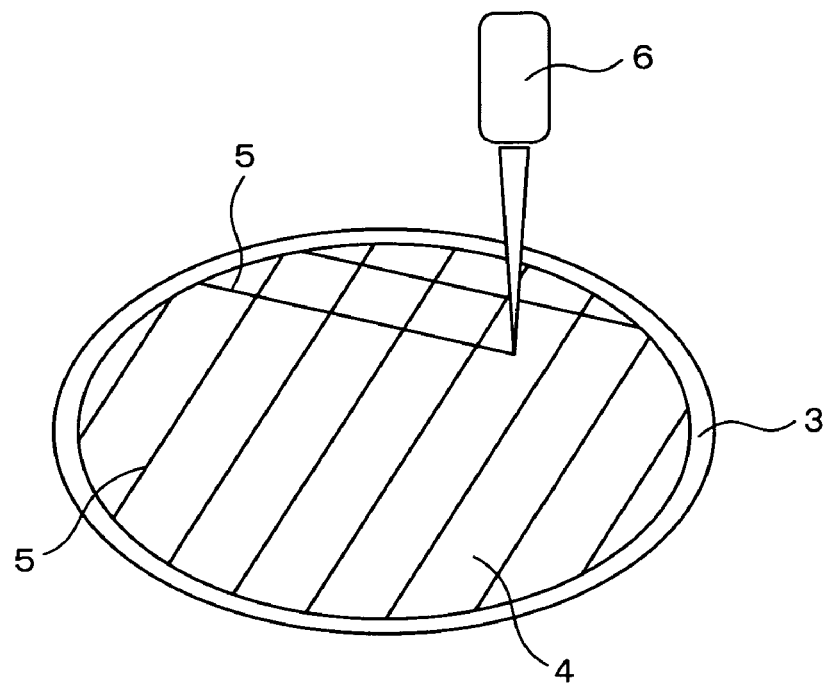
FIG. 2 is a schematic view showing a condition in which an adhesive film is cut in the embodiment of the invention.
Figure 3:
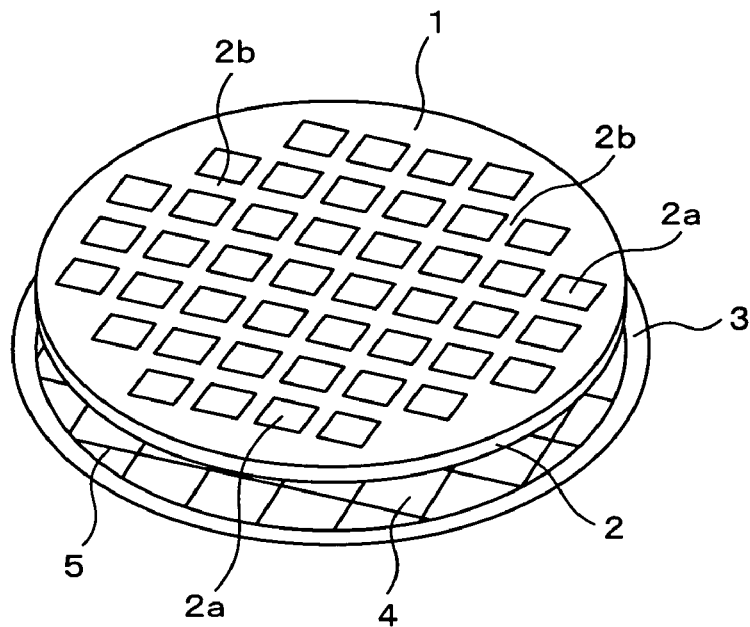
FIG. 3 is a schematic view showing a condition just before a semiconductor wafer is overlapped with the adhesive film in the embodiment of the invention.
Figure 7:
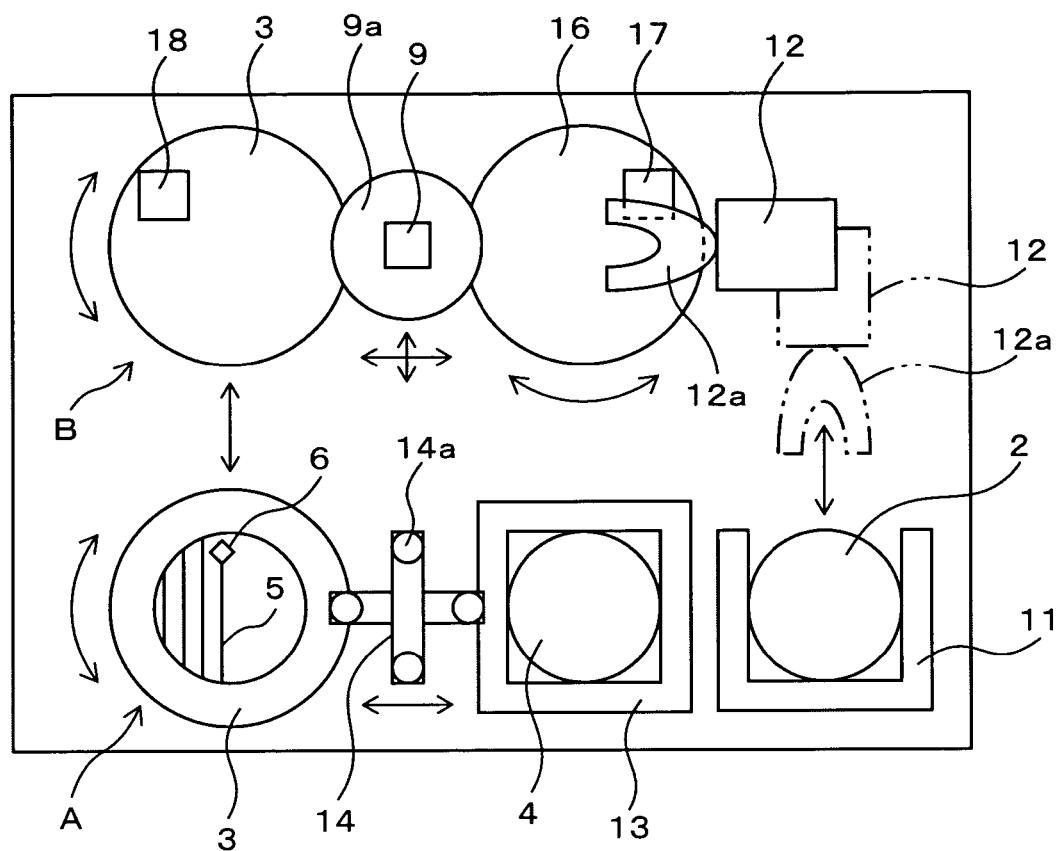
FIG. 7 is a plan view of a semiconductor processing apparatus of the embodiment of the invention.
Figure 8:
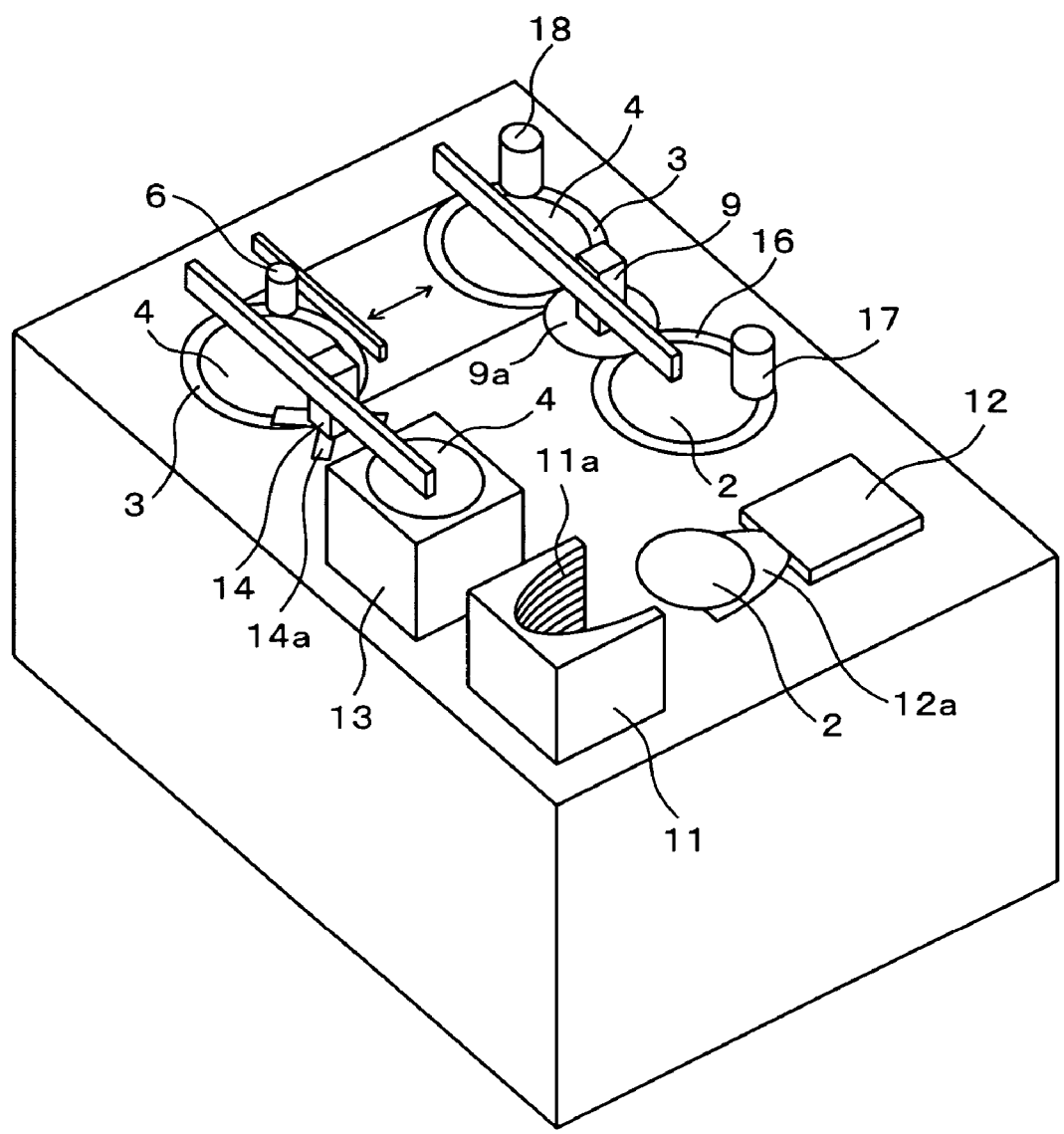
FIG. 8 is a schematic view of the semiconductor processing apparatus of the embodiment of the invention.

FIG. 2 illustrates an adhesive film. The adhesive film 4 is the same shape and size as those of the semiconductor wafer 2. Onto the back surface of the adhesive film 4 is stuck a peeling sheet (not illustrated) via an adhesive agent. FIGS. 7 and 8 show an apparatus for processing the semiconductor wafer 2. First, explanation will be made below on a semiconductor wafer processing apparatus illustrated in FIGS. 7 and 8.

In FIGS. 7 and 8, reference numeral 11 designates a cassette, in which the plurality of semiconductor wafers 2 are contained in a vertical arrangement. In the cassette 11 are formed a plurality of racks 11a for supporting the semiconductor wafers 2, respectively. Adjacent to the cassette 11 is disposed a stocker 13, in which the adhesive films 4 are contained in superimposition. Moreover, a suction table 3 is arranged adjacent to the stocker 13. The suction table 3 has a disk-shaped horizontal upper surface, and is turned clockwise or counterclockwise by a rotary drive mechanism, not illustrated, around on a rotary axis in a vertical direction. In addition, the suction table 3 can be moved in front and rear directions, that is, in a vertical direction in FIG. 7 by a drive mechanism, not illustrated, so as to reciprocate between a cutting stage A, at which the adhesive film 4 is cut, and a bonding stage B, at which the semiconductor wafer 2 is bonded onto the adhesive film 4. The movement in the front and rear directions also is utilized in feeding during a cutting operation by a laser, described later. A suctioning system of the suction table 3 is a well-known vacuum chuck. At the suction table 3 is formed a suction hole penetrating from an obverse surface to a back surface, to which an air suction port of a vacuum device, not illustrated, is connected. When the vacuum device is actuated, the adhesive film 4 is adapted to be suctioned to and held on the suction table 3.

Above the suction table 3 is disposed a laser head 6. The laser head 6 is adapted to irradiate a laser to the adhesive film 4, which is moved in the front and rear directions by the suction table 3. In addition, the laser head 6 is such configured as to be freely moved in a lateral direction, so as to move along the cutting line with respect to the adhesive film 4. Between the suction table 3 and the stocker 13 is interposed a transportation mechanism 14, which reciprocates therebetween for supplying the adhesive film 4 to the suction table 3. The transportation mechanism 14 includes an adsorptive pad 14a which is movable in the vertical direction. The adsorptive pad 14a is a vacuum chuck, like the suction table 3. The adsorptive pad 14a adsorbs and holds the adhesive film 4 stacked in the stocker 13, and then, places the adhesive film 4 at the center of the suction table 3.

In FIGS. 7 and 8, two suction tables 3 are shown in states in which the suction table 3 is positioned at both of the cutting stage A and the bonding stage B respectively. Above the suction table 3 positioned at the bonding stage B is disposed a CCD camera. The CCD camera 18 takes a photograph of the adhesive film 4 held on the suction table 3, and then, the photographed image is analyzed by a control means such as a personal computer.

Adjacent to the bonding stage B is arranged a positioning table 16. The positioning table 16 is rotated clockwise or counterclockwise by a rotary drive mechanism, not illustrated, around on a rotary axis in the vertical direction. The positioning table 16 is a vacuum chuck, like the suction table 3, so as to adsorb and hold the semiconductor wafer 2 placed thereon. Between the bonding stage B and the positioning table 16 is interposed a transportation mechanism 9, which can be moved in the front and rear directions and lateral direction and reciprocates therebetween for placing the semiconductor wafer 2 on the adhesive film 4 mounted on the suction table 3. The transportation mechanism 9 includes an adsorptive pad 9a which is made of a light transmissible material. The adsorptive pad 9a can be moved in the vertical direction. The adsorptive pad 9a is a vacuum chuck, like the suction table 3. The adsorptive pad 9a adsorbs and holds the semiconductor wafer 2 placed on the positioning table 16, and then, places it on the adhesive film 4.

Above the positioning table is disposed a CCD camera 17 for taking a photograph of the semiconductor wafer 2. Between the positioning table 16 and the cassette 11 is interposed a robot 12. is the robot 12 is provided with a chuck 12a and with the chuck 12a, the robot 12 transports the semiconductor wafers 2 contained inside of the cassette 11 one by one onto the positioning table 16.

[2] First Embodiment

Subsequently, a description will be given of steps of processing the semiconductor wafer 2 by the semiconductor wafer processing apparatus having the above-described configuration. In a first embodiment, the back surface of the semiconductor wafer is ground into a predetermined thickness; the adhesive film, which has been cut in advance, is stuck onto the back surface of the semiconductor wafer; and only the semiconductor wafer is cut.

First, protective film 1 is stuck on the semiconductor wafer 2 having the devices 2a formed thereon is covered with the protective film 1, and then, the back surface is ground into a predetermined thickness. Here, a stress eliminating step by etching or polishing may be performed in order to eliminate an inside stress occurring on the semiconductor wafer 2 by the grinding. Next, the semiconductor wafer 2 is contained in the cassette 11, and then, the cassette 11 is set at a predetermined position in the semiconductor wafer processing apparatus. In the meantime, the adhesive films 4, each having the peeling sheet stuck onto the back surface thereof, are contained in the stocker 13 in superimposition, and then, the stocker 13 is set at another predetermined position in the semiconductor wafer processing apparatus. Thereafter, the adhesive film 4 is suctioned by the adsorptive pad 14a of the transportation mechanism 14, to be then transported onto the suction table 3, in which the adhesive film 4 on the side of the peeling sheet is suctioned and held on the center of the suction table 3.

Next, the suction table 3 and the laser head 6 are located at predetermined cutting start positions, respectively. The suction table 3 is moved forward or rearward with the irradiation of the laser on the adhesive film 4, thereby cutting the adhesive film 4. Upon completion of a cutting operation along one cutting line, the laser head 6 is moved rightward, to perform a next cutting operation along a next cutting line. In this manner, the cutting operation is performed along all of cutting lines in the front and rear directions. Thereafter, the suction table 3 is rotated by an angle of 90°, and then, the cutting operation is performed along all of cutting lines in the same manner as described above. In this way, the adhesive film 3 is cut into the same shape and size as the streets 2b of the semiconductor wafer 2.

Upon completion of the cutting operation of the adhesive film 4, the suction table 3 is moved to the bonding stage B. The adhesive film 4 placed on the suction table 3 is photographed by the CCD camera 18. In the meantime, the semiconductor wafer 2 is placed on the positioning table 16 by the robot 12, to be suctioned and held on the upper surface of the positioning table 16. The semiconductor wafer 2 also is photographed by the CCD camera 17. The images photographed by the CCD cameras 17 and 18 are analyzed, thereby detecting a relative angular displacement between the adhesive film 4 and the semiconductor wafer 2. In the case where there is an angular displacement between the adhesive film 4 and the semiconductor wafer 2, the displacement is eliminated by rotating the suction table 3 or the positioning table 16.

Figure 5:
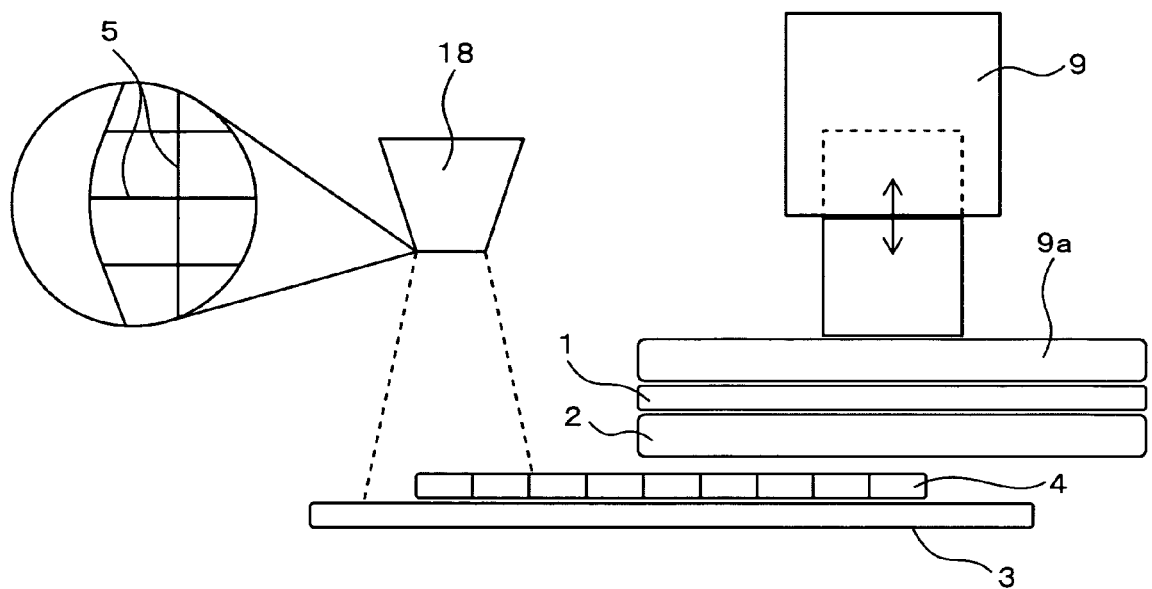
FIG. 5 is a side view showing a condition in which a semiconductor wafer is transferred to an upper space of the adhesive film.
Figure 6:
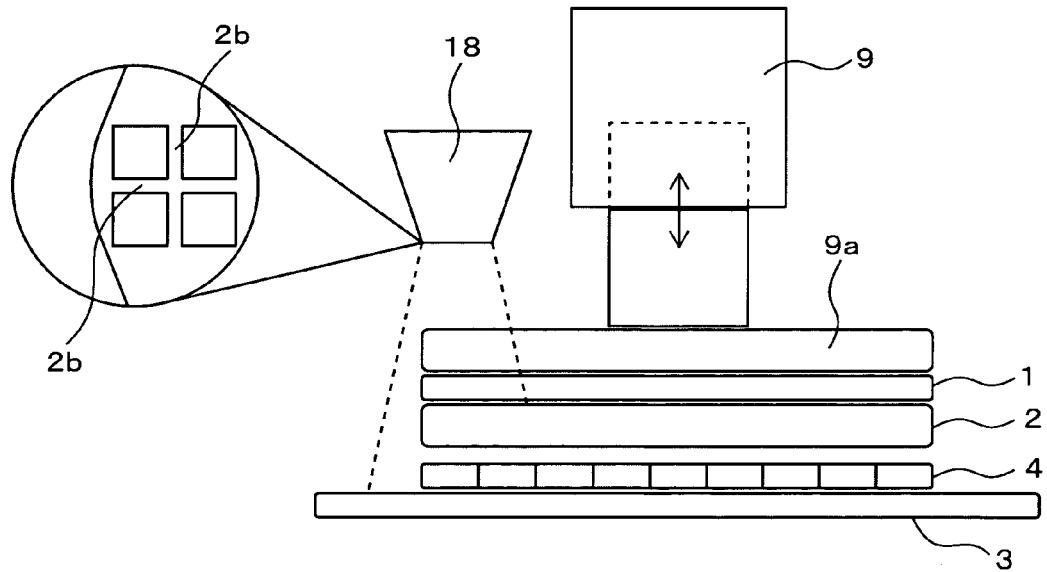
FIG. 6 is a side view showing a condition in which a semiconductor wafer is positioned at the upper space of the adhesive film.

Subsequently, the semiconductor wafer 2 is suctioned by descending the adsorptive pad 9a of the transportation mechanism 9, and then, the semiconductor wafer 2 is transported above the adhesive film 4, that is, at a position at which the outlines of the semiconductor wafer 2 and the adhesive film 4 overlap each other, as shown in FIG. 5. Thereafter, the adsorptive pad 9a is descended and stopped immediately before the semiconductor wafer 2 is brought into contact with the adhesive film 4, so that the position of the adsorptive pad 9a in the front and rear directions and lateral direction is corrected while comparing a pattern of a cutting line 5 on the adhesive film 4 photographed by the CCD camera 18 with the street 2b formed on the semiconductor wafer 2 being photographed by the CCD camera at that time (see FIG. 6). When the adsorptive pad 9a is stopped at a correct position, it is descended, thereby depressing the semiconductor wafer 2 against the adhesive film 4. At this time, the adhesive film 4 is bonded onto the semiconductor wafer 2 by heating the adhesive film 4 by, for example, the heater or the like incorporated in the suction table 3.

Figure 4A:
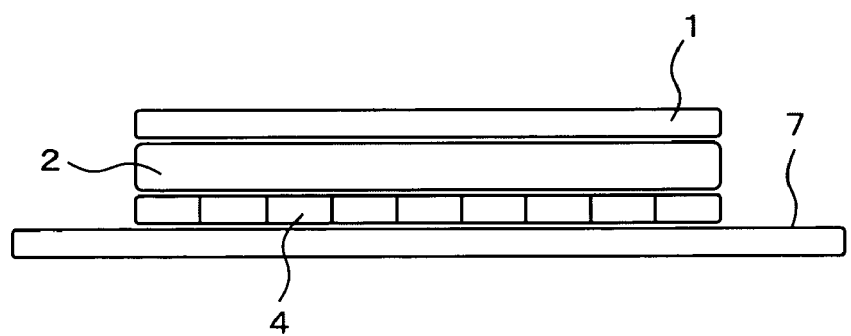
FIGS. 4A and 4B are cross sections showing a condition in which a semiconductor wafer is overlapped with the adhesive film in the embodiment of the invention.

Next, a dicing tape 7 is stuck onto the back surface (i.e., the peeling sheet) of the adhesive film 4 (see FIG. 4A), and further, the protective film 1 is peeled off from the surface of the semiconductor wafer 2, and in this state, the semiconductor wafer 2 is installed in a dicing apparatus. A dicing operation may be performed by cutting with a blade or by a laser. In this dicing operation, only the semiconductor wafer 2 is cut into the individual devices 2a, thus preventing any clogging of the blade by the adhesive film 4 or any occurrence of a burr at the adhesive film 4. Moreover, since the adhesive film 4 is cut by the laser, it is possible to readily apply with devices 2a having various sizes and shapes or a very thin adhesive film 4, and further, to produce an advantage of no need of a precise press or die.

At a stage when the dicing operation is completed, the devices 2a are connected to each other via the peeling sheet and the dicing tape 7. In this state, the semiconductor wafer 2 (i.e., the device 2a) is transported to a die bonding apparatus. The device 2a is peeled off from an interface between the peeling sheet and the adhesive film 4 by pushing up from the side of the dicing tape with a needle or the like, to be thus packed on a substrate or the like.

[3] Second Embodiment

Next, a description will be given of steps of processing the semiconductor wafer 2 in a second embodiment according to the present invention. In the second embodiment, a semiconductor wafer is divided in advance into individual devices, and further, an adhesive film cut in advance is stuck onto the back surface of the device, so that only the semiconductor wafer is cut.

First of all, slits are formed in a predetermined depth by a processing method such as dicing along the streets 2b formed on the obverse surface of the semiconductor wafer 2 having the devices 2a formed thereon, and further, the protective film 1 is stuck on the obverse surface. Subsequently, the back surface of the semiconductor wafer 2 is ground. When the slit emerges as the grinding proceeds, the semiconductor wafer 2 is divided into the individual devices 2a, which are connected to each other with the protective film 1, to be prevented from being separated from each other. Here, for the sake of simple explanation, the semiconductor wafer in the above-described state also is referred to as the semiconductor wafer 2.

If tension is applied to the protective film 1 when the protective film 1 is stuck onto the semiconductor wafer 2, a die shift, meaning variance of a clearance between the devices 2a when the semiconductor wafer 2 is divided into the individual devices 2a, becomes significant. Therefore, the protective film 1 unrolled from a roll should be avoided from being stuck onto the semiconductor wafer 2. It is desirable that, for example, the protective film 1 cut in the same shape and size as those of the semiconductor wafer 2 should be stuck onto the semiconductor wafer 2 in a vacuum without any application of tension to the protective film 1. In addition, a material of the protective film 1 is desirably made of a resin which is hardly contracted such as PET. Alternatively, a stress eliminating process by etching or polishing may be performed so as to eliminate an inside stress occurring at the device 2a by grinding.

Subsequently, the semiconductor wafer 2 divided into the individual devices 2a is contained inside of the cassette 11, which is set at a predetermined position in the semiconductor wafer processing apparatus. Incidentally, at this stage, since the individual devices 2a are merely connected to each other via the protective film 1, the shape of the semiconductor wafer 2 cannot be maintained only by the protective film 1. As a consequence, the cassette 11 containing the semiconductor wafer 2 therein should be desirably provided with a rack plate for supporting the semiconductor wafer 2 with all of surfaces thereof. In the same manner, the chuck 12a of the robot 12 for handling the semiconductor wafer 2 should be preferably an adsorptive pad capable of suctioning substantially the entire surface of the protective film 1.

In the meantime, the adhesive films 4, each having the peeling sheet stuck onto the back surface thereof, are contained in the stocker 13 in superimposition, and then, the stocker 13 is set at another predetermined position in the semiconductor wafer processing apparatus. Thereafter, the adhesive film 4 is suctioned by the adsorptive pad 14a of the transportation mechanism 14, to be then transported onto the suction table 3, on which the adhesive film 4 on the side of the peeling sheet is suctioned and held on the center of the suction table 3.

Next, the suction table 3 and the laser head 6 are located at predetermined cutting start positions, respectively. The suction table 3 is moved forward or rearward with the irradiation of the laser on the adhesive film 4, thereby cutting the adhesive film 4. Upon completion of a cutting operation along one cutting line, the laser head 6 is moved rightward, to perform a next cutting operation along a next cutting line. In this manner, the cutting operation is performed along all of cutting lines in the front and rear directions. Thereafter, the suction table 3 is rotated at an angle of 90°, and then, the cutting operation is performed along all of cutting lines in the same manner as described above. In this way, the adhesive film 3 is cut in the same shape and size as the outline of the device 2a of the semiconductor wafer 2.

Upon completion of the cutting operation of the adhesive film 4, the suction table 3 is moved to the bonding stage B. The adhesive film 4 placed on the suction table 3 is photographed by the CCD camera 18. In the meantime, the semiconductor wafer 2 is placed on the positioning table 16 by the robot 12, to be suctioned and held on the upper surface of the positioning table 16. The semiconductor wafer 2 also is photographed by the CCD camera 17. The images photographed by the CCD cameras 17 and 18 are analyzed, thereby detecting a relative angular displacement between the adhesive film 4 and the semiconductor wafer 2. In the case where there is an angular displacement between the adhesive film 4 and the semiconductor wafer 2, the displacement is eliminated by rotating the suction table 3 or the positioning table 16.

Subsequently, the protective film 1 connecting the devices 2a is suctioned by descending the adsorptive pad 9a of the transportation mechanism 9, and then, the semiconductor wafer 2 is transported above the adhesive film 4, that is, at a position at which the outlines of the semiconductor wafer 2 and the adhesive film 4 overlap each other, as shown in FIG. 5. Thereafter, the adsorptive pad 9a is descended and stopped immediately before the device 2a is brought into contact with the adhesive film 4, so that the position of the adsorptive pad 9a in the front and rear directions and lateral directions is corrected while comparing a pattern of a cutting line 5 on the adhesive film 4 photographed by the CCD camera 18 with the outline of the device 2a being photographed by the CCD camera at that time (see FIG. 6). When the adsorptive pad 9a is stopped at a correct position, it is descended, thereby depressing the device 2a against the adhesive film 4. At this time, the adhesive film 4 is bonded onto the device 2a by heating the adhesive film 4 by, for example, the heater or the like incorporated in the suction table 3.

Figure 4B:
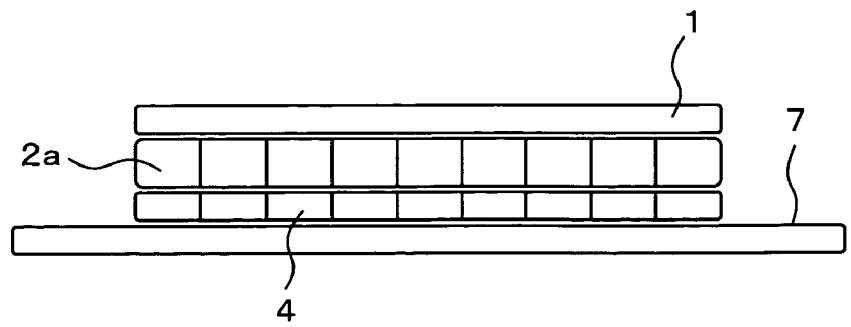

Next, a dicing tape 7 is stuck onto the back surface (i.e., the peeling sheet) of the adhesive film 4 (see FIG. 4B), and further, the protective film 1 is peeled off from the surface of the semiconductor wafer 2. In this state, the individual devices 2a are connected to each other via the peeling sheet and the dicing tape 7. In this state, the semiconductor wafer 2 (i.e., the device 2a) is transported to a die bonding apparatus. The device 2a is peeled off from an interface between the peeling sheet and the adhesive film 4 by pushing up from the side of the dicing tape with a needle or the like, to be thus packed on a substrate or the like.

In the above-described the second embodiment, the devices 2a having the adhesive film 4 individually adhering thereto can be obtained by peeling off the protective film 1 from the devices 2a, thereby avoiding an inconvenience of a damage on the device caused by the irradiation of the laser through a clearance defined between the devices, which the prior art has undergone. Furthermore, since the adhesive film is cut by the laser, the present invention is readily applicable to devices having various sizes and shapes or a very thin adhesive film, with an attendant advantage of no need for a precise press or die.

What is claimed is:

1. A method for processing a semiconductor wafer, comprising:
   preparing a semiconductor wafer having plural devices divided by streets on a front surface thereof;
   cutting an adhesive film into a shape and a size identical to those of the streets by a laser beam;
   positioning the semiconductor wafer such that the streets coincide with cut lines of the cut adhesive film;
   adhering the cut adhesive film to a back surface of the semiconductor wafer; and
   cutting the semiconductor wafer, which has the cut adhesive film adhered to the back surface thereof, along the streets, thereby making pieces of devices.

2. A method for processing a semiconductor wafer, comprising:
   preparing a semiconductor wafer having plural devices divided by streets on a front surface thereof;
   cutting the semiconductor wafer along the streets, thereby making pieces of devices;
   cutting an adhesive film into a shape and a size identical to those of the streets by a laser beam;
   positioning the pieces of devices such that contours thereof coincide with cut lines of the cut adhesive film; and
   adhering the cut adhesive film to a back surface of the pieces of devices.

3. The method for processing a semiconductor wafer according to claim 1, wherein a liner sheet is provided on a back surface of the adhesive film, and the adhesive film is completely cut by the laser beam.

4. The method for processing a semiconductor wafer according to claim 2, wherein a liner sheet is provided on a back surface of the adhesive film, and the adhesive film is completely cut by the laser beam.

5. The method for processing a semiconductor wafer according claim 1, wherein the adhesive film is cut while being absorbed by an adsorption table, and the semiconductor wafer or the devices are adhered to the adhesive film in this condition.

6. The method for processing a semiconductor wafer according to claim 2, wherein the adhesive film is cut while being absorbed by an adsorption table, and the semiconductor wafer or the devices are adhered to the adhesive film in this condition.

7. The method for processing a semiconductor wafer according to claim 5, wherein the adsorption table comprises a heater, the adhesive film is composed of a material which has adhesive properties by heating, whereby the adhesive film is adhered to the semiconductor wafer of the devices by being heated by the heater.

8. The method for processing a semiconductor wafer according to claim 6, wherein the adsorption table comprises a heater, the adhesive film is composed of a material which has adhesive properties by heating, whereby the adhesive film is adhered to the semiconductor wafer of the devices by being heated by the heater.

* * * * *